United States Patent
Tsutsumi et al.

(10) Patent No.: US 9,964,582 B2
(45) Date of Patent: May 8, 2018

(54) MOTOR CONTROL DEVICE THAT DETECTS BREAKAGE OF MOTOR POWER LINE OR POWER ELEMENT ABNORMALITY OF MOTOR POWER CONVERSION DEVICE

(71) Applicant: FANUC CORPORATION, Yamanashi (JP)

(72) Inventors: Tomohisa Tsutsumi, Yamanashi (JP); Yuuki Morita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days. days.

(21) Appl. No.: 14/703,256

(22) Filed: May 4, 2015

(65) Prior Publication Data

US 2015/0326167 A1    Nov. 12, 2015

(30) Foreign Application Priority Data

May 8, 2014   (JP) .................................. 2014-096965

(51) Int. Cl.
| | |
|---|---|
| *H02P 6/28* | (2016.01) |
| *G01R 31/42* | (2006.01) |
| *G01R 31/02* | (2006.01) |
| *H02P 29/02* | (2016.01) |

(52) U.S. Cl.
CPC .............. *G01R 31/026* (2013.01); *H02P 6/28* (2016.02); *H02P 29/023* (2013.01); *G01R 31/42* (2013.01)

(58) Field of Classification Search
CPC ......... G01R 31/026; G01R 31/42; H02P 6/28; H02P 29/023

USPC ............................................. 318/490; 361/31
See application file for complete search history.

(56) References Cited

U.S. PATENT DOCUMENTS

| | | | | |
|---|---|---|---|---|
| 5,784,268 A | * | 7/1998 | Steffek | H02M 7/48 307/46 |
| 5,955,863 A | * | 9/1999 | Iwashita | H02P 21/22 318/812 |
| 7,443,645 B2 | * | 10/2008 | Ohshima | H02H 3/093 361/79 |

(Continued)

FOREIGN PATENT DOCUMENTS

| | | |
|---|---|---|
| CN | 1118878 A | 3/1996 |
| CN | 1778033 A | 5/2006 |

(Continued)

*Primary Examiner* — Eduardo Colon Santana
*Assistant Examiner* — Devon Joseph
(74) *Attorney, Agent, or Firm* — Hauptman Ham, LLP

(57) ABSTRACT

A motor control device includes a current command calculation unit configured to calculate a current command value for driving a motor, a current detection unit configured to detect a value of a current that flows through a power line of the motor, a current deviation calculation unit configured to calculate a current deviation, which is a difference between the current command value and the detected current value, a voltage command calculation unit configured to calculate a voltage command value applied to the motor based on the current deviation, a filter processing unit configured to calculate data by filtering the current deviation, the absolute value of the current deviation, or the power of the current deviation and to output the data as index data, and a power line breakage detection unit configured to detect a breakage of the power line based on the index data.

3 Claims, 14 Drawing Sheets

(56) References Cited

U.S. PATENT DOCUMENTS

| | | | | |
|---|---|---|---|---|
| 2003/0058589 A1* | 3/2003 | Matsumoto | B62D 5/0487 | 361/23 |
| 2003/0085678 A1* | 5/2003 | Yamada | H02P 21/22 | 318/400.02 |
| 2003/0222612 A1* | 12/2003 | Matsushita | B62D 5/0487 | 318/437 |
| 2004/0232865 A1* | 11/2004 | Suzuki | H02P 21/22 | 318/400.21 |
| 2005/0077853 A1* | 4/2005 | Nagakura | H02M 7/48 | 318/432 |
| 2006/0001392 A1* | 1/2006 | Ajima | B62D 5/046 | 318/432 |
| 2006/0043917 A1* | 3/2006 | Kifuku | B62D 5/0481 | 318/432 |
| 2007/0064359 A1* | 3/2007 | Shima | H02P 21/22 | 361/31 |
| 2008/0267235 A1* | 10/2008 | Ando | H01S 3/097 | 372/38.02 |
| 2009/0160381 A1* | 6/2009 | Imura | H02P 21/0003 | 318/400.15 |
| 2009/0323232 A1* | 12/2009 | Suzuki | H02M 1/32 | 361/23 |
| 2013/0135907 A1* | 5/2013 | Oi | H02J 3/01 | 363/40 |
| 2014/0054103 A1* | 2/2014 | Kezobo | B62D 5/0487 | 180/446 |

FOREIGN PATENT DOCUMENTS

| | | |
|---|---|---|
| EP | 1292012 A2 | 3/2003 |
| JP | 59-72989 A | 4/1984 |
| JP | 2003-153401 A | 5/2003 |
| JP | 2004-96933 A | 3/2004 |
| JP | 2004-320945 A | 11/2004 |
| JP | 2007-274849 A | 10/2007 |
| JP | 2009-050059 A | 3/2009 |
| JP | 2010-88205 A | 4/2010 |
| JP | 2011-259523 A | 12/2011 |
| JP | 2013-31356 A | 2/2013 |
| JP | 2013-38950 A | 2/2013 |

\* cited by examiner

MOTOR CONTROL DEVICE THAT DETECTS BREAKAGE OF MOTOR POWER LINE OR POWER ELEMENT ABNORMALITY OF MOTOR POWER CONVERSION DEVICE

CROSS-REFERENCE TO RELATED APPLICATIONS

This application is a new U.S. patent application that claims benefit of JP 2014-096965, filed on May 8, 2014, the entire contents of JP 2014-096965 is hereby incorporated by reference.

FIELD OF THE INVENTION

The present invention relates to a motor control device, in particular, to a motor control device having a function to detect the presence/absence of a breakage of a motor power line or the presence/absence of an abnormality of a power element of a motor power conversion device.

BACKGROUND OF THE INVENTION

In the case of a three-phase motor, there is a possibility that the motor can rotate even if one power line in one phase of the power lines in three phases enters the broken state. This is also true in the case where a power element of a motor power conversion device enters the open state and is destroyed and power is not supplied to one phase. In the case such as this, the motor is not controlled normally, and therefore, there is a case where a high voltage is applied to the motor or a case where large current flows, and there is a possibility that the motor may fail.

The power line of a general motor is not provided with a sensor for detecting a breakage and generally, the presence/absence of a breakage of the power line is determined indirectly by detecting whether or not current flows through the power line in the case where a voltage is applied to the power line.

For a motor control device that performs PWM control, as one of the methods for detecting the presence/absence of a breakage of the power line of a motor, there is known a method for analyzing current that flows through the power line when turning ON/OFF a switching device such as an IGBT (Insulated Gate Bipolar Transistor) so as to apply a predetermined voltage to each phase (e.g., Publication of Japanese Unexamined Patent Application No. 2009-50059 A).

However, with this method, it is necessary to perform the detection operation after temporarily turning OFF the current control, and therefore, it is not possible to detect a breakage while controlling a motor in an excited state. In other words, with this method, it is not possible to detect a breakage in the case where the power line enters the broken state during the control of the motor.

Because of this, there is known a method for determining that the power line is broken in the case where a deviation becomes one in a certain degree by monitoring the deviation between a current command value and the value of current that flows through the motor (e.g., Publication of Japanese Unexamined Patent Application No. 2004-320945 A).

In the prior art, the current deviation is monitored as it is, and therefore, such problems as follows occur.

(1) There is a delay in the current control loop, and therefore, at the instant that the current command changes, the current deviation becomes an amount corresponding to the change in the current command. Consequently, if the current deviation is monitored as it is, there is a strong possibility that erroneous detection will occur.

(2) Due to factors such as noise that has piled up on the current value, even if the power line is connected normally, there is a possibility that the current deviation will be large and erroneous detection will occur as a result.

Further, the method does not take into consideration the case where the current deviation becomes large when the voltage command value, which is the output of the current control loop, reaches the upper limit value, i.e., when the voltage command value saturates, and therefore, if this method is used for monitoring at all times, there may be a possibility that a breakage of the power line is detected erroneously.

SUMMARY OF THE INVENTION

The motor control device according to an embodiment of the present invention is a motor control device that drives a three-phase motor based on a current command including: a current command calculation unit configured to calculate a current command value for driving a motor; a current detection unit configured to detect the value of current that flows through a power line of the motor; a current deviation calculation unit configured to calculate a current deviation, which is a difference between the current command value and the detected current value; a voltage command calculation unit configured to calculate a voltage command value that is applied to the motor based on the current deviation; a filter processing unit configured to calculate data obtained by filtering one of the current deviation, the absolute value of the current deviation, and the power of the current deviation, and to output the data as index data for detecting a breakage of the power line; and a power line breakage detection unit configured to detect the breakage of the power line based on the index data.

DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

In the following, with reference to the drawings, a motor control device according to the present invention is explained. However, it should be noted that the technical scope of the present invention is not limited to embodiments and encompasses the inventions described in the claims and equivalents thereof.

First Embodiment

Figure 1:
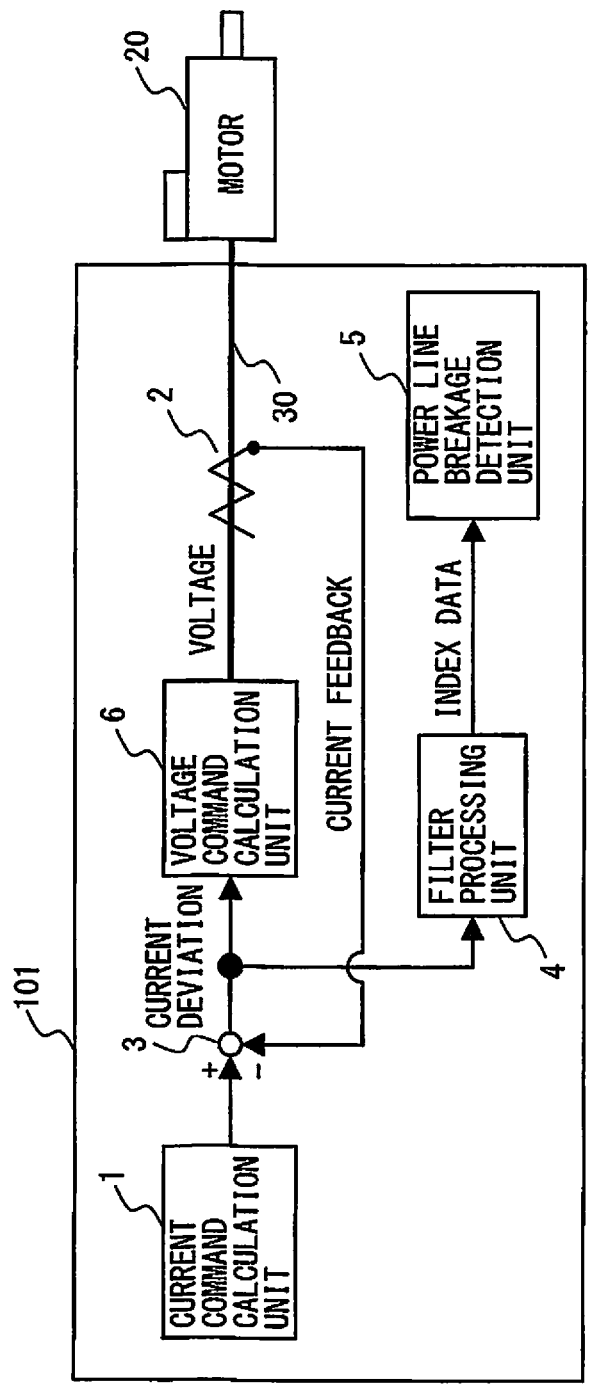
FIG. 1 is a configuration diagram of a motor control device according to a first embodiment of the present invention.

First, a motor control device according to a first embodiment of the present invention is explained by using the drawings. FIG. 1 is a configuration diagram of a motor control device according to the first embodiment of the present invention. A motor control device 101 according to the first embodiment of the present invention is a motor control device that drives a three-phase motor 20 based on a current command and includes: a current command calculation unit 1 configured to calculate a current command value for driving the motor 20; a current detection unit 2 configured to detect the value of current that flows through a power line 30 of the motor; a current deviation calculation unit 3 configured to calculate a current deviation, which is a difference between the current command value and the detected current value; a voltage command calculation unit 6 configured to calculate a voltage command value that is applied to the motor based on the current deviation; a filter processing unit 4 configured to calculate data that is obtained by filtering one of the current deviation, the absolute value of the current deviation, and the power of the current deviation and to output the data as index data for detecting a breakage of the power line; and a power line breakage detection unit 5 configured to detect a breakage of the power line based on the index data.

The current command calculation unit 1 calculates a current command value based on a torque command and outputs the current command value to the current deviation calculation unit 3. The current deviation calculation unit 3 is a subtracter and calculates a current deviation, which is a difference between the current command value and the detected current value, by subtracting the current value detected by the current detection unit 2 from the current command value calculated by the current command calculation unit 1.

The current deviation calculated by the current deviation calculation unit 3 is output to the voltage command calculation unit 6 and the filter processing unit 4. The voltage command calculation unit 6 calculates a voltage command value that is applied to the motor 20 based on the current deviation. The current detection unit 2 detects the value of current that flows through the power line 30 of the motor when the voltage command value output from the voltage command calculation unit 6 is applied to the motor, and feeds back the current value to the current deviation calculation unit 3.

The filter processing unit 4 calculates data obtained by filtering one of the current deviation, the absolute value of the current deviation, and the power of the current deviation in order to compensate for a delay that occurs in the current control loop and to remove noise that has piled up on the current value. The data on which the filter processing unit 4 has performed the filter processing is output to the power line breakage detection unit 5 as index data for detecting a breakage of the power line 30.

As the target of the filter processing, the value with which the influence of a breakage of the power line seems large is selected from among the current deviation, the absolute value of the current deviation, and the power of the current deviation. For example, in the case where the current command is an alternating-current command, the "current deviation" is selected in order to correctly evaluate a deviation from an ideal (command). In the case where the influence of a breakage of the power line appears as a deviation having a short cycle, the "absolute value of the current deviation" is selected in order to evaluate a deviation from an ideal (command) as an enlarged deviation. In the case where the current command is small and the current deviation itself is small, the "power of the current deviation" is selected in order to enlarge the deviation.

The power line breakage detection unit 5 detects whether or not the power line is broken based on the relationship in magnitude between the index data and a prescribed value. In other words, in the case where the index data is greater than the prescribed value, the power line breakage detection unit 5 determines that the power line is broken. On the other hand, in the case where the index data is equal to or less than the prescribed value, the power line breakage detection unit 5 determines that the power line is not broken. It is possible to store the prescribed value in a memory (not illustrated) within the power line breakage detection unit 5.

In the motor control device 101 according to the first embodiment of the present invention, the index data for the determination of a breakage of the power line is calculated by performing filter processing on the current deviation or the like and the presence/absence of a breakage of the power line is determined based on the index data. Because of this, even in the case where the current command value has changed considerably or where large noise has piled up on the current value, it is possible to avoid a breakage of the power line from being erroneously detected and it is possible to accurately determine the presence/absence of a breakage of the power line.

Figure 2:
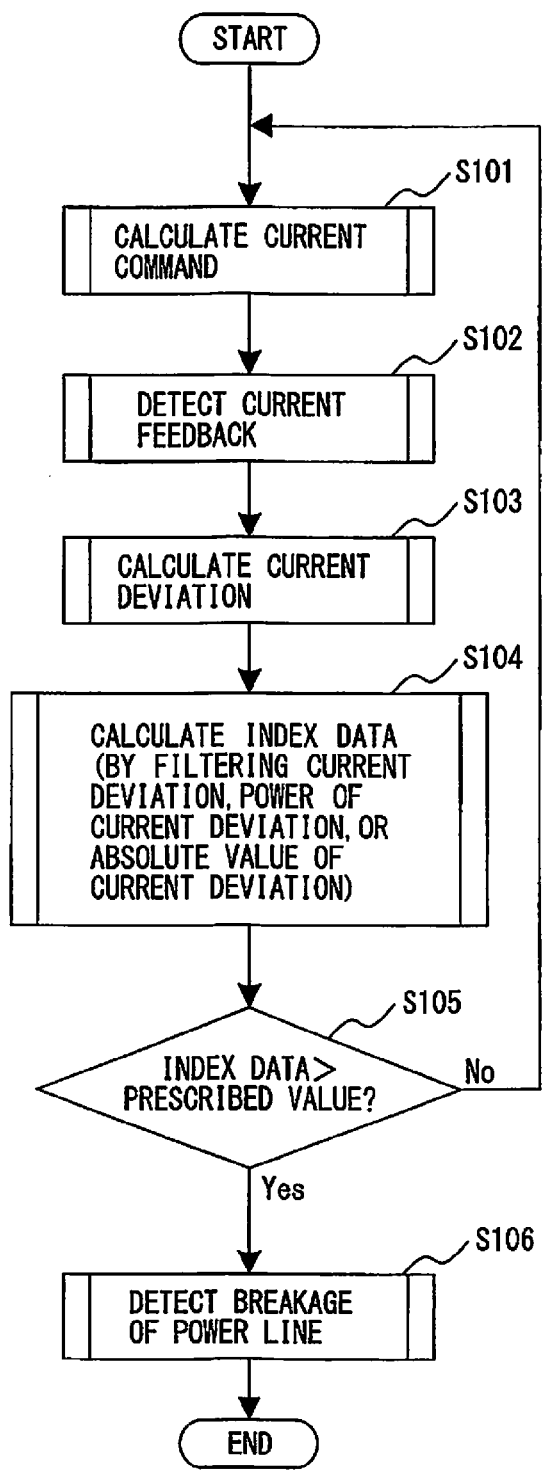
FIG. 2 is flowchart for explaining a procedure to detect a breakage of a power line performed by the motor control device according to the first embodiment of the present invention.

Next, an operation procedure of the motor control device according to the first embodiment of the present invention is explained. FIG. 2 is a flowchart for explaining a procedure to detect a breakage of the power line performed by the motor control device according to the first embodiment of the present invention.

First, at step S101, the current command calculation unit 1 calculates a current command value for driving the motor. Next, at step S102, the current detection unit 2 detects the value of a current that flows through the power line 30 of the motor and feeds back the detected current value to the current deviation calculation unit 3.

Next, at step S103, the current deviation calculation unit 3 calculates a current deviation, which is a difference between the current command value and the detected current value. Next, at step S104, the filter processing unit 4 calculates index data for detecting a breakage of the power line. The calculation of index data is performed by filtering one of the current deviation, the absolute value of the current deviation, and the power of the current deviation. The calculated index data is output to the power line breakage detection unit 5.

Next, at step S105, the power line breakage detection unit 5 determines the presence/absence of a breakage of the power line based on the relationship in magnitude between the index data and a prescribed value. In the case where the index data exceeds the prescribed value, at step S106, the power line breakage detection unit 5 determines that the power line is in the broken state. On the other hand, in the case where the index data is equal to or less than the prescribed value, the power line breakage detection unit 5 determines that the power line is not in the broken state, and the procedure returns to step S101 and the determination of the presence/absence of a breakage of the power line is continued based on a new current command value.

As above, in the motor control device according to the first embodiment of the present invention, the presence/absence of a breakage of the power line is determined based on the index data calculated by filtering the current deviation, and therefore, even in the case where the current command value has varied considerably or even in the case where large noise has piled up on the detected current value, it is possible to accurately determine breakage of the power line without erroneously detecting a breakage.

Second Embodiment

Figure 3:
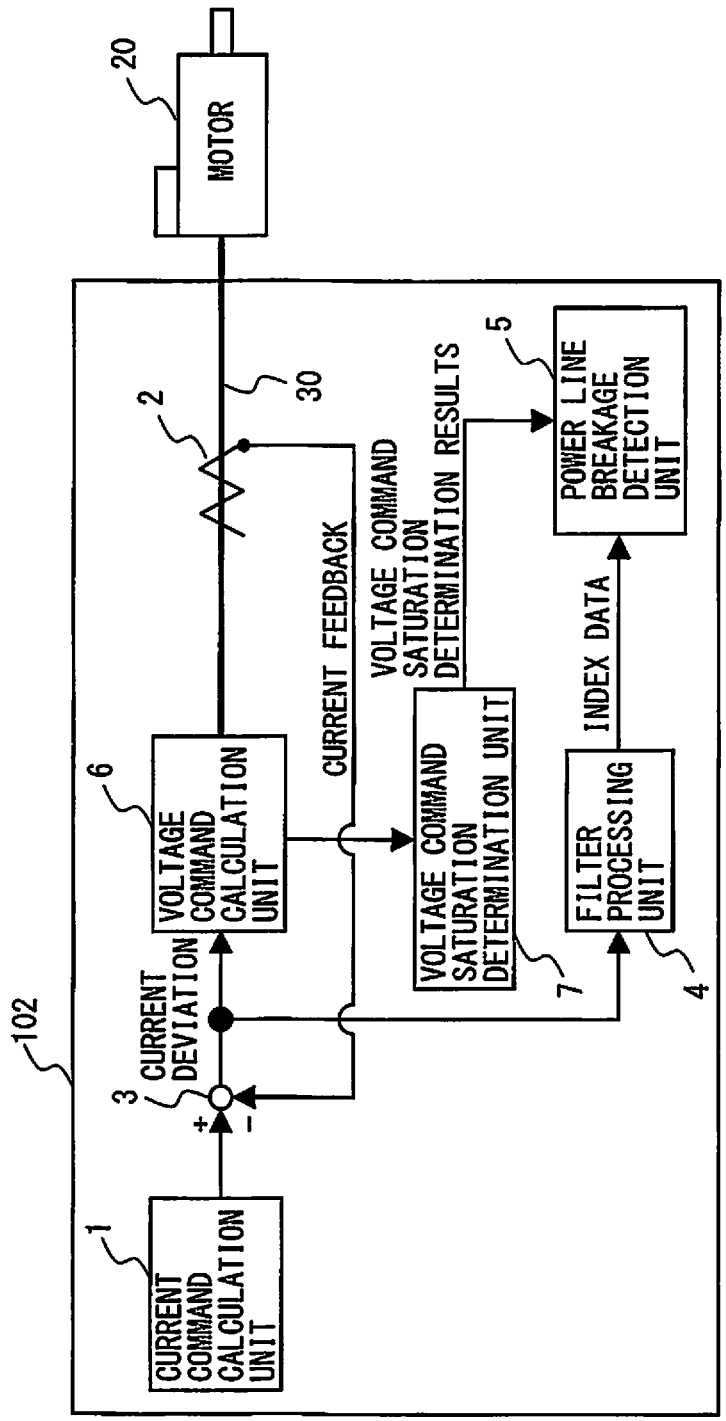
FIG. 3 is a configuration diagram of a motor control device according to a second embodiment of the present invention.

Next, a motor control device according to a second embodiment of the present invention is explained by using the drawings. FIG. 3 is a configuration diagram of a motor control device according to the second embodiment of the present invention. A motor control device 102 according to the second embodiment of the present invention differs from the motor control device 101 according to the first embodiment in that a voltage command saturation determination unit 7 configured to determine whether or not the voltage command value has saturated and to output the results as voltage command saturation determination results is further provided and in that the power line breakage detection unit 5 detects the presence/absence of a breakage of the power line based on the index data only in the case of determining that the voltage command value has not saturated in accordance with the voltage command saturation determination results. On the other hand, in the case of determining that the voltage command value has saturated, the power line breakage detection unit 5 suspends the detection of a breakage of the power line. Other configurations of the motor control device 102 according to the second embodiment are the same as those of the motor control device 101 according to the first embodiment, and therefore, a detailed explanation is omitted.

The voltage command saturation determination unit 7 acquires the voltage command value calculated by the voltage command calculation unit 6, compares the voltage command value and a prescribed voltage value, and determines that the voltage command value has saturated in the case where the voltage command value exceeds the prescribed voltage value, which is the suppliable voltage of the motor drive unit, or determines that the voltage command value has not saturated in the case where the voltage command value is equal to or less than the prescribed voltage value. The voltage command saturation determination unit 7 outputs the determination results to the power line breakage detection unit 5 as the voltage command saturation determination results.

As in the first embodiment, the power line breakage detection unit 5 receives the index data from the filter processing unit 4 and determines whether or not the detection of a breakage of the power line is performed based on whether or not the voltage command value has saturated. In other words, in the case of determining that the voltage command value has not saturated in accordance with the voltage command saturation determination results, the power line breakage detection unit 5 detects the presence/absence of a breakage of the power line based on the index data. On the other hand, in the case of determining that the voltage command value has saturated, the power line breakage detection unit 5 suspends the detection of a breakage of the power line.

In the case where the voltage command value has saturated, in other words, in the case where the voltage command value, which is the output of the current control loop, has reached the upper limit value, there is a possibility that the current deviation will become large, and therefore, if the presence/absence of a breakage of the power line is determined in the state such as this, erroneous detection may result. Because of this, in the motor control device according to the second embodiment, in the case where the voltage command value has saturated, erroneous detection is avoided by suspending the detection of a breakage of the power line.

Figure 4:
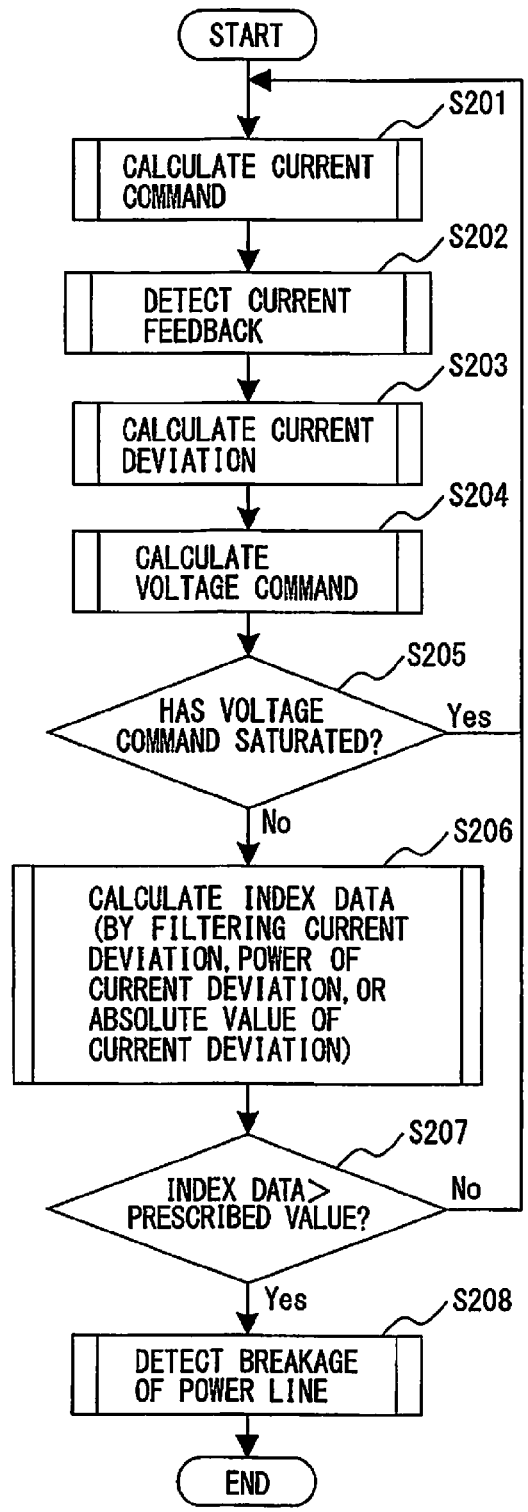
FIG. 4 is flowchart for explaining a procedure to detect a breakage of a power line performed by the motor control device according to the second embodiment of the present invention.

Next, an operation procedure of the motor control device according to the second embodiment of the present invention is explained. FIG. 4 is a flowchart for explaining a procedure to detect a breakage of the power line performed by the motor control device according to the second embodiment of the present invention.

First, at step S201, the current command calculation unit 1 calculates a current command value for driving the motor. Next, at step S202, the current detection unit 2 detects the value of current that flows through the power line 30 of the motor and feeds back the detected current value to the current deviation calculation unit 3.

Next, at step S203, the current deviation calculation unit 3 calculates a current deviation, which is a difference between the current command value and the detected current value. Next, at step S204, the voltage command calculation unit 6 calculates a voltage command value that is applied to the motor based on the current deviation.

Next, at step S205, the voltage command saturation determination unit 7 determines whether or not the voltage command value has saturated and outputs the results as voltage command saturation determination results. In the case of determining that the voltage command value has not saturated in accordance with the voltage command saturation determination results, the power line breakage detection unit 5 detects a breakage of the power line at step S207 based on the index data for detecting a breakage of the power line, which has been calculated at step S206. On the other hand, in the case of determining that the voltage command value has saturated, the power line breakage detection unit 5 suspends the detection of a breakage of the power line, and the procedure returns to step S201 and the detection of a breakage of the power line is continued based on a new current command value.

The calculation of the index data at step S206 is performed by the filter processing unit 4 filtering one of the current deviation, the absolute value of the current deviation, and the power of the current deviation. The calculated index data is output to the power line breakage detection unit 5 and at step S207, the power line breakage detection unit 5 detects the presence/absence of a breakage of the power line based on the relationship in magnitude between the index data and a prescribed value. In the case where the index data exceeds the prescribed value, at step S208, the power line breakage detection unit 5 determines that the power line is in the broken state. On the other hand, in the case where the index data is equal to or less than the prescribed value, the power line breakage detection unit 5 determines that the power line is not in the broken state, and the procedure returns to step S201 and the determination of the presence/absence of a breakage of the power line is continued based on a new current command value.

As above, in the motor control device according to the second embodiment, only in the case where the voltage command value has not saturated, the presence/absence of a breakage of the power line is determined. In other words, in the case where the voltage command value has saturated, the detection of a breakage of the power line is suspended and after checking that the voltage command value has not saturated, the presence/absence of a breakage of the power line is determined. Because of this, it is possible to avoid erroneous detection of a breakage of the power line due to the saturation of the voltage command value.

Third Embodiment

Figure 5:
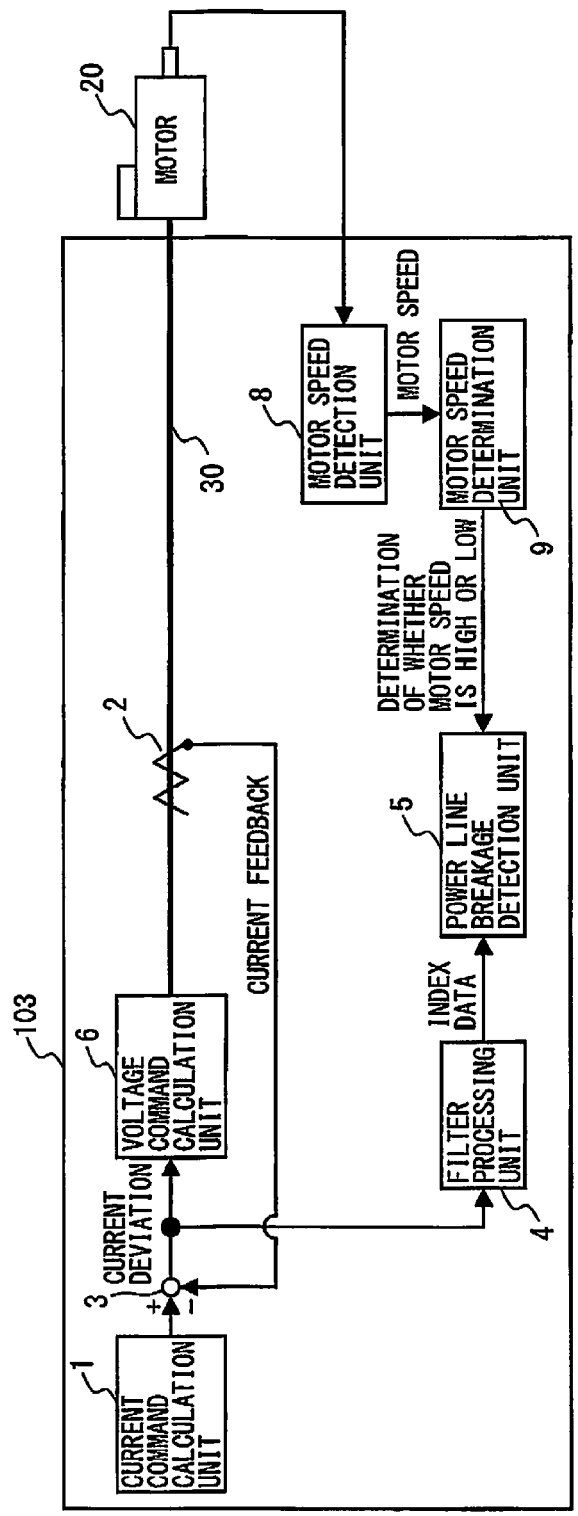
FIG. 5 is a configuration diagram of a motor control device according to a third embodiment of the present invention.

Next, a motor control device according to a third embodiment of the present invention is explained by using the drawings. FIG. 5 is a configuration diagram of a motor control device according to the third embodiment of the present invention. A motor control device 103 according to the third embodiment of the present invention differs from the motor control device 101 according to the first embodiment in that a motor speed detection unit 8 configured to detect the rotation speed of the motor and a motor speed determination unit 9 configured to determine whether or not the rotation speed of the motor is higher than a prescribed speed are further provided and in that the power line breakage detection unit 5 detects a breakage of the power line based on index data only in the case where the rotation speed of the motor is equal to or lower than the prescribed speed. On the other hand, in the case where the rotation speed of the motor is higher than the prescribed speed, the detection of a breakage of the power line is suspended. Other configurations of the motor control device 103 according to the third embodiment are the same as those of the motor control device 101 according to the first embodiment, and therefore, detailed explanation is omitted.

Normally, the voltage command that is applied to the motor increases in proportion to the motor speed. However, in the state where the power line is broken, the current does not flow through the broken phase, and therefore, there is a case where the voltage command increases and the voltage command saturates. Because of this, in the case where the voltage command has saturated, if the detection of a breakage of the power line is suspended as in the second embodiment, there is a possibility that a breakage of the power line will not be detected.

Because of this, in the motor control device according to the third embodiment, the motor speed detection unit 8 configured to detect the rotation speed of the motor and the motor speed determination unit 9 configured to determine whether or not the rotation speed of the motor is higher than the prescribed speed are provided and thus the rotation speed of the motor is monitored. In the case where the rotation speed of the motor is equal to or lower than the prescribed speed, the power line breakage detection unit 5 detects a breakage of the power line based on the index data and in the case where the rotation speed of the motor is higher than the prescribed speed, the detection of a breakage of the power line is suspended. In this manner, the detection of a breakage of the power line is performed after checking that the rotation speed of the motor is in a range where the voltage command does not saturate at the normal time, and therefore, it is possible to accurately detect the presence/absence of a breakage of the power line.

Figure 6:
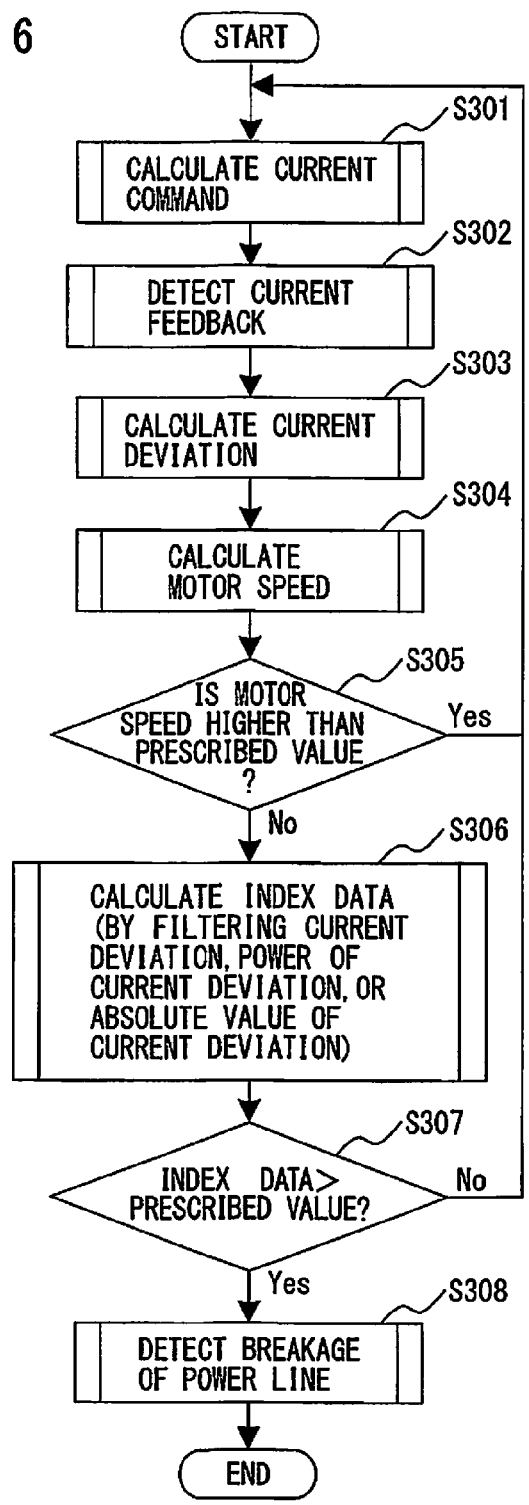
FIG. 6 is flowchart for explaining a procedure to detect a breakage of a power line performed by the motor control device according to the third embodiment of the present invention.

Next, the operation procedure of the motor control device according to the third embodiment of the present invention is explained. FIG. 6 is a flowchart for explaining a procedure to detect a breakage of the power line performed by the motor control device according to the third embodiment of the present invention.

First, at step S301, the current command calculation unit 1 calculates a current command value for driving the motor. Next, at step S302, the current detection unit 2 detects the value of a current that flows through the power line 30 of the motor and feeds back the detected current value to the current deviation calculation unit 3.

Next, at step S303, the current deviation calculation unit 3 calculates a current deviation, which is a difference between the current command value and the detected current value. Next, at step S304, the motor speed detection unit 8 detects the rotation speed of the motor 20. It is possible to perform the detection of the rotation speed of the motor 20 by using an encoder (not illustrated) provided with the motor.

Next, at step S305, the motor speed determination unit 9 determines whether or not the rotation speed of the motor is higher than a prescribed speed. It is possible to store the data of the prescribed speed in a memory (not illustrated) provided within the motor speed determination unit 9.

In the case where it is determined that the rotation speed of the motor (motor speed) is higher than the prescribed speed at step S305, the detection of a breakage of the power line is suspended and then the procedure returns to step S301 and the detection of a breakage of the power line is continued based on a new current command value. On the other hand, in the case where the motor speed is equal to or slower than the prescribed speed, the detection of a breakage of the power line is performed at step S306 and the subsequent steps.

At step S306, the filter processing unit 4 calculates index data for detecting a breakage of the power line. The calculation of index data is performed by filtering one of the current deviation, the absolute value of current deviation, and the power of the current deviation. The calculated index data is output to the power line breakage detection unit 5.

Next, at step S307, the power line breakage detection unit 5 detects the presence/absence of a breakage of the power line based on the relationship in magnitude between the index data and a prescribed value. In the case where the index data exceeds the prescribed value, the power line breakage detection unit 5 determines that the power line is broken at step S308. On the other hand, in the case where the index data is equal to or less than the prescribed value, the power line breakage detection unit 5 determines that the power line is not broken, and the procedure returns to step S301 and the determination of the presence/absence of a breakage of the power line is continued based on a new current command value.

As above, in the motor control device according to the third embodiment of the present invention, the presence/absence of a breakage of the power line is detected after checking that the rotation speed of the motor is in a range where the voltage command does not saturate at the normal time, and therefore, it is possible to accurately detect the presence/absence of a breakage of the power line.

Fourth Embodiment

Figure 7:
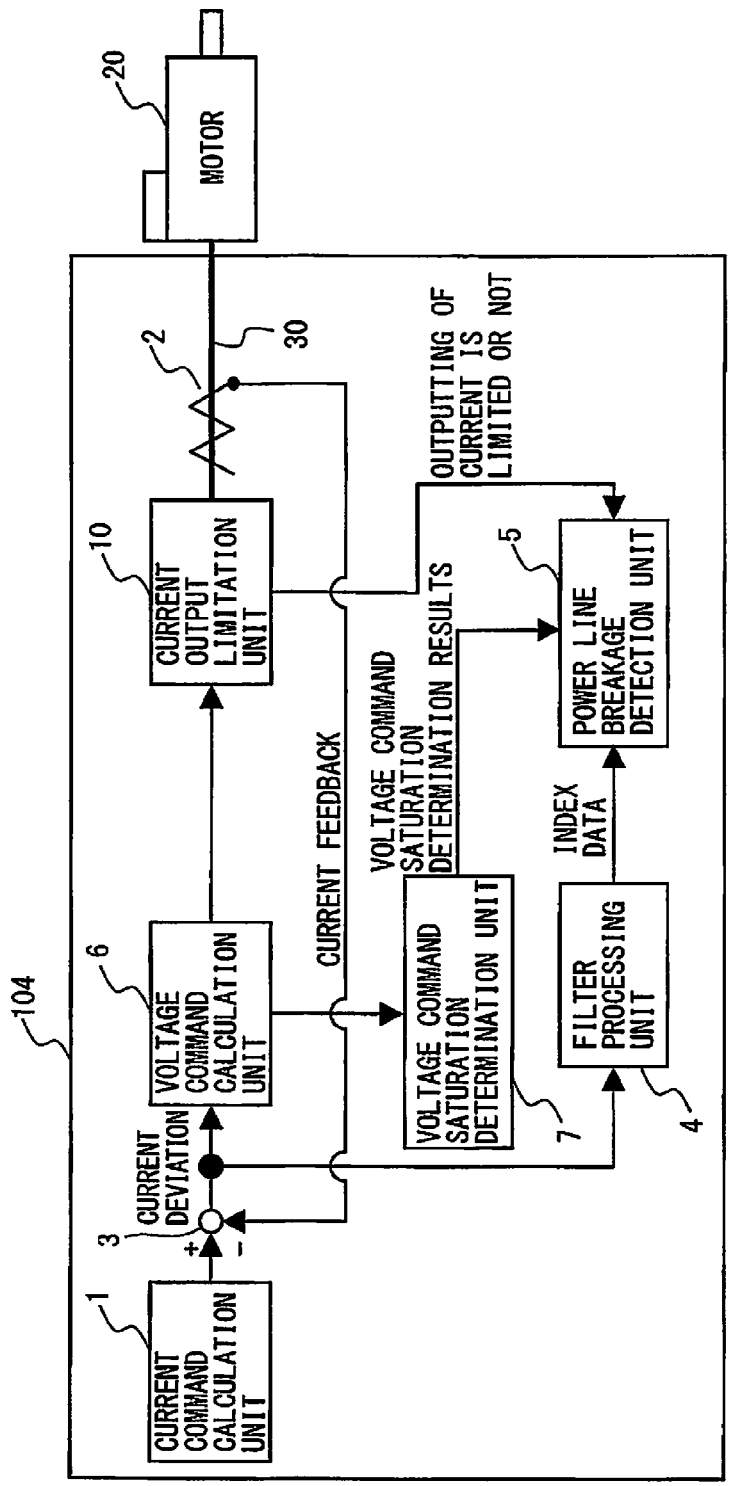
FIG. 7 is a configuration diagram of a motor control device according to a fourth embodiment of the present invention.

Next, a motor control device according to a fourth embodiment of the present invention is explained by using the drawings. FIG. 7 is a configuration diagram of a motor control device according to the fourth embodiment of the present invention. A motor control device 104 according to the fourth embodiment of the present invention differs from the motor control device 102 according to the second embodiment in that a current output limitation unit 10 configured to limit outputting of current in the case where the current value for driving the motor exceeds a prescribed value is further provided and only in the case where the voltage command saturation determination unit 7 determines that the voltage command value has not saturated and the current output limitation unit 10 is not limiting the outputting of current, the power line breakage detection unit 5 detects a breakage of the power line based on index data. In the case where the voltage command saturation determination unit 7 determines that the voltage command value has saturated, or in the case where the current output limitation unit 10 is limiting the outputting of current, the detection of a breakage of the power line is suspended. Other configurations of the motor control device 104 according to the fourth embodiment are the same as those of the motor control device 102 according to the second embodiment, and therefore, detailed explanation is omitted.

In the motor control device 102 according to the second embodiment, the voltage command saturation determination unit 7 determines whether or not the voltage command value has saturated and in the case where the voltage command value has not saturated, the presence/absence of a breakage of the power line of the motor is detected. In contrast to this, in the motor control device 104 according to the fourth embodiment, the current output limitation unit 10 is provided in addition to the voltage command saturation determination unit 7, and only in the case where the outputting of current is not limited, the presence/absence of a breakage of the power line of the motor is detected.

The current output limitation unit 10 limits current that flows through the motor in order to prevent an over-current from flowing through the motor and in the case such as this, it seems that the current value to be detected by the current detection unit 2 will become very small because the current that flows through the motor is limited temporarily, and therefore, the current deviation to be calculated by the current deviation calculation unit 3 will become a very large value. Because of this, if the presence/absence of a breakage of the power line is determined in this situation, there is a possibility that the power line will be erroneously determined to be broken despite the fact that the power line is not broken. Because of this, in the motor control device according to the present embodiment, the current output limitation unit 10 is provided and in the situation where the value of the current that flows through the motor is limited, the detection of the presence/absence of a breakage of the power line is suspended. On the other hand, in the case where the current to the motor is not limited, as in the motor control device of the second embodiment, it is possible to detect the presence/absence of a breakage of the power line of the motor. With the configuration such as this, it is made possible to accurately detect the presence/absence of a breakage of the power line by taking into consideration the limitation of current to the motor.

In the motor control device according to the fourth embodiment, as in the second embodiment, the voltage command saturation determination unit 7 is provided and the presence/absence of saturation of the voltage command value is also determined. Consequently, in the motor control device according to the fourth embodiment, in the case where the voltage command saturation determination unit 7 determines that the voltage command value has not saturated and the current output limitation unit 10 is not limiting the outputting of current, a breakage of the power line is detected based on the index data. On the other hand, in the case where the voltage command saturation determination unit 7 determines that the voltage command value has saturated or in the case where the current output limitation unit 10 is limiting the outputting of current, the detection of a breakage of the power line is suspended. In this manner, an abnormality of the value of the current that flows through the motor is removed from the two viewpoints of the voltage saturation and the current limitation, and therefore, it is possible to accurately detect the presence/absence of a breakage of the power line of the motor.

Figure 8:
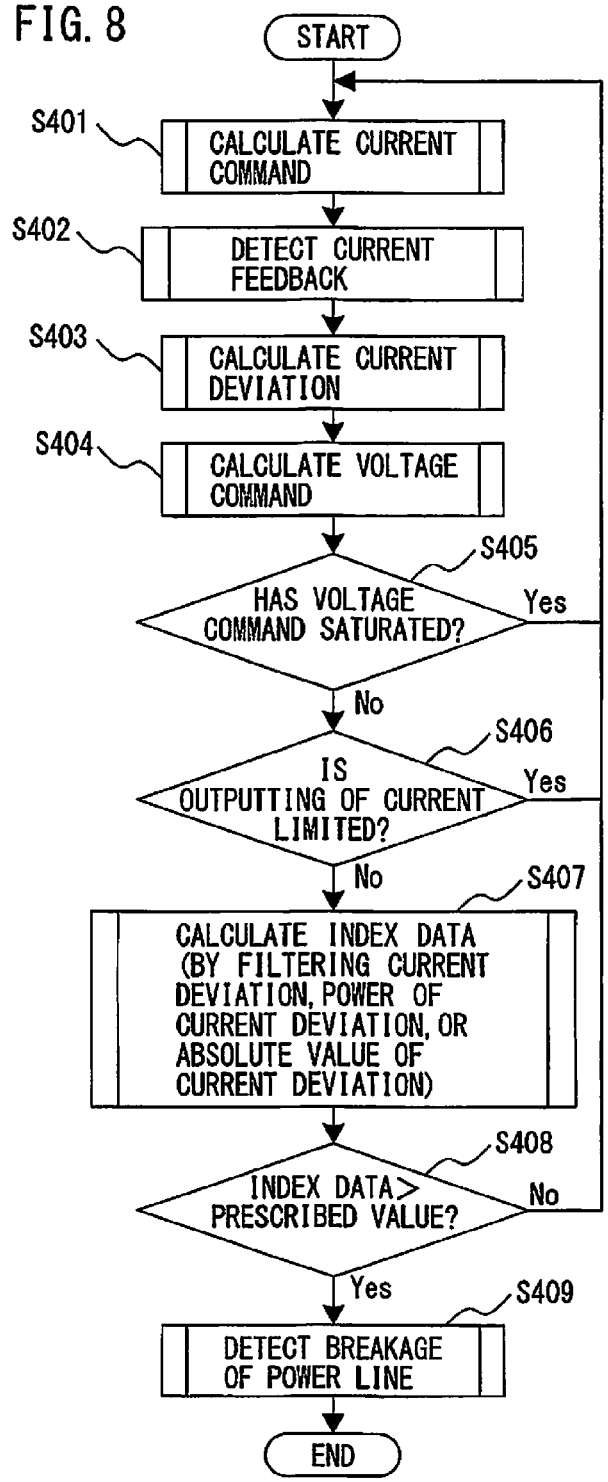
FIG. 8 is flowchart for explaining a procedure to detect a breakage of a power line performed by the motor control device according to the fourth embodiment of the present invention.

Next, an operation procedure of the motor control device according to the fourth embodiment of the present invention is explained. FIG. 8 is a flowchart for explaining a procedure to detect a breakage of the power line performed by the motor control device according to the fourth embodiment of the present invention.

First, at step S401, the current command calculation unit 1 calculates a current command value for driving the motor. Next, at step S402, the current detection unit 2 detects the value of current that flows through the power line 30 of the motor and feeds back the detected current value to the current deviation calculation unit 3.

Next, at step S403, the current deviation calculation unit 3 calculates a current deviation, which is a difference between the current command value and the detected current value. Next, at step S404, the voltage command calculation unit 6 calculates a voltage command value that is applied to the motor based on the current deviation.

Next, at step S405, the voltage command saturation determination unit 7 determines whether or not the voltage command value has saturated and outputs the results as voltage command saturation determination results. In the case where the voltage command value is determined to have saturated, the detection of a breakage of the power line is suspended, and the procedure returns to step S401 and the detection of a breakage of the power line is continued based on a new current command value.

On the other hand, in the case where the voltage command saturation determination unit 7 determines that the voltage command value has not saturated, whether or not the current output limitation unit 10 is limiting the outputting of current is determined at step S406. In the case where the outputting of current is limited, the procedure returns to step S401 and the detection of a breakage of the power line is continued based on a new current command value. On the other hand, in the case where the outputting of current is not limited, the detection of a breakage of the power line is performed at step S407 and the subsequent steps.

At step S407, the filter processing unit 4 calculates index data for detecting a breakage of the power line. The calculation of index data is performed by filtering one of the current deviation, the absolute value of current deviation, and the power of the current deviation. The calculated index data is output to the power line breakage detection unit 5.

Next, at step S408, the power line breakage detection unit 5 detects the presence/absence of a breakage of the power line based on the relationship in magnitude between the index data and a prescribed value. In the case where the index data exceeds the prescribed value, the power line breakage detection unit 5 determines that the power line is broken at step S409. On the other hand, in the case where the index data is equal to or less than the prescribed value, the power line breakage detection unit 5 determines that the power line is not broken, and the procedure returns to step S401 and the determination of the presence/absence of a breakage of the power line is continued based on a new current command value.

As above, in the motor control device according to the fourth embodiment, only in the case where the voltage command value has not saturated and the current to the motor is not limited, the presence/absence of a breakage of the power line of the motor is detected, and therefore, it is possible to accurately detect the presence/absence of a breakage of the power line of the motor.

Fifth Embodiment

Figure 9:
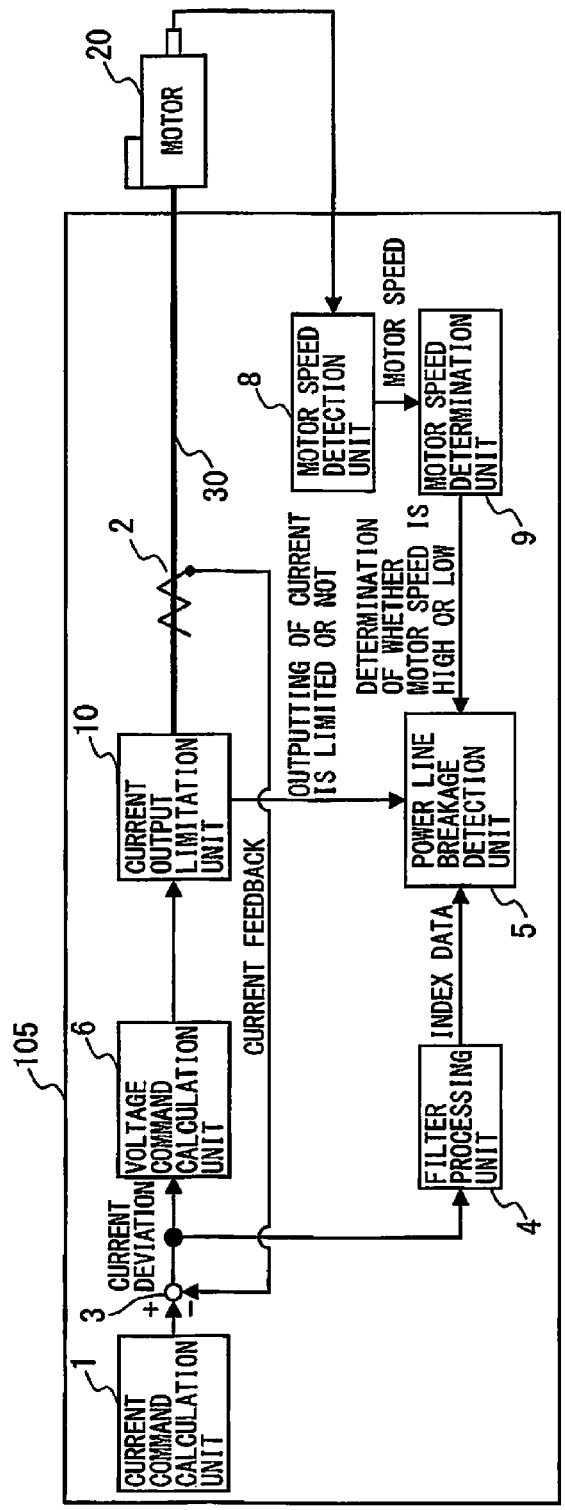
FIG. 9 is a configuration diagram of a motor control device according to a fifth embodiment of the present invention.

Next, a motor control device according to a fifth embodiment of the present invention is explained by using the drawings. FIG. 9 is a configuration diagram of a motor control device according to the fifth embodiment of the present invention. A motor control device 105 according to the fifth embodiment of the present invention differs from the motor control device 103 according to the third embodiment in that the current output limitation unit 10 configured to limit outputting of current in the case where the current value for driving the motor exceeds a prescribed value is further provided and only in the case where the rotation speed of the motor is equal to or less than the prescribed speed and the current output limitation unit 10 is not limiting the outputting of current, the power line breakage detection unit 5 detects a breakage of the power line based on index data. In the case where the rotation speed of the motor is higher than the prescribed speed or in the case where the current output limitation unit 10 is limiting the outputting of current, the detection of a breakage of the power line is suspended. Other configurations of the motor control device 105 according to the fifth embodiment are the same as those of the motor control device 103 according to the third embodiment, and therefore, detailed explanation is omitted.

In the motor control device 103 according to the third embodiment, the motor speed detection unit 8 configured to detect the rotation speed of the motor and the motor speed determination unit 9 configured to determine whether or not the rotation speed of the motor is higher than the prescribed speed are provided and the rotation speed of the motor is monitored, and only in the case where the rotation speed of the motor is equal to or less than the prescribed speed, a breakage of the power line is detected based on the index data. In the motor control device 105 according to the fifth embodiment, the current output limitation unit 10 is provided in addition to the above units and in the case where the outputting of current is not limited, the presence/absence of a breakage of the power line of the motor is detected.

The current output limitation unit 10 limits current that flows through the motor in order to prevent an over-current from flowing through the motor and in such a case, it seems that the current value to be detected by the current detection unit 2 will become very small because the current that flows through the motor is limited temporarily.

However, as the result of limiting the current that flows through the motor, the current value that is detected by the current detection unit 2 drops temporarily and if the presence/absence of a breakage of the power line is determined based on the current deviation in this state, there is a possibility that the power line will be erroneously determined to be broken despite the fact that the power line is not broken. Because of this, in the motor control device according to the fifth embodiment, in the case where the outputting of current is limited by the current output limitation unit 10, the detection of a breakage of the power line is not performed in order to avoid erroneous detection of a breakage due to the limitation of the current. In this manner, by detecting the presence/absence of a breakage of the power line only in the case where the rotation speed of the motor is equal to or less than the prescribed speed and the current is not limited, it is possible to avoid erroneous detection of a breakage of the power line.

Figure 10:
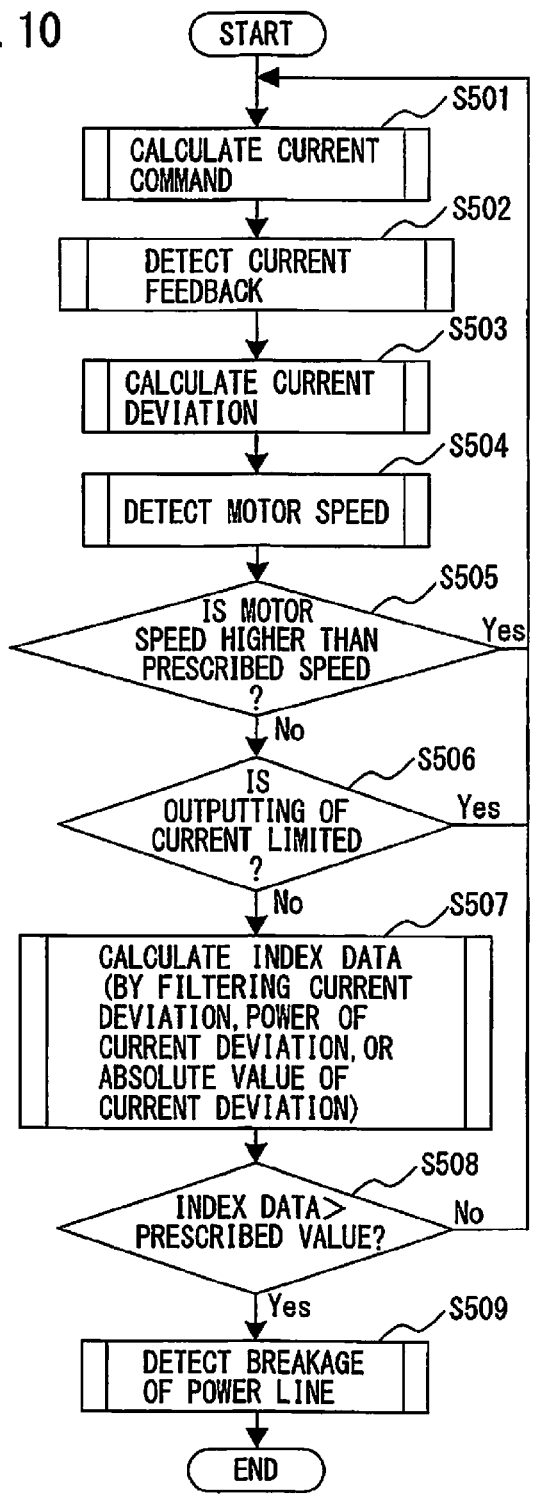
FIG. 10 is flowchart for explaining a procedure to detect a breakage of a power line performed by the motor control device according to the fifth embodiment of the present invention.

Next, an operation procedure of the motor control device according to the fifth embodiment of the present invention is explained. FIG. 10 is a flowchart for explaining a procedure to detect a breakage of the power line performed by the motor control device according to the fifth embodiment of the present invention.

First, at step S501, the current command calculation unit 1 calculates a current command value for driving the motor. Next, at step S502, the current detection unit 2 detects the value of current that flows through the power line 30 of the motor and feeds back the detected current value to the current deviation calculation unit 3.

Next, at step S503, the current deviation calculation unit 3 calculates a current deviation, which is a difference between the current command value and the detected current value. Next, at step S504, the motor speed detection unit 8 detects the rotation speed of the motor 20. It is possible to detect the rotation speed of the motor by using an encoder (not illustrated) that is provided with the motor.

Next, at step S505, the motor speed determination unit 9 determines whether or not the rotation speed of the motor is higher than the prescribed speed. It is possible to store the data of the prescribed speed in advance in a memory (not illustrated) provided within the motor speed determination unit 9.

In the case where the rotation speed of the motor (motor speed) is determined to be higher than the prescribed speed at step S505, the detection of a breakage of the power line is suspended, and the procedure returns to step S501 and detection of a breakage of the power line is continued based on a new current command value.

On the other hand, in the case where the motor speed is equal to or less than the prescribed speed, whether or not the current output limitation unit 10 is limiting the outputting of current is determined at step S506. In the case where the outputting of current is limited, the procedure returns to step S501 and the detection of a breakage of the power line is continued based on a new current command value. In the case where the outputting of current is not limited, the detection of a breakage of the power line is performed at step S507 and the subsequent steps.

At step S507, the filter processing unit 4 calculates index data for detecting a breakage of the power line. The calculation of index data is performed by filtering one of the current deviation, the absolute value of the current deviation, and the power of the current deviation. The calculated index data is output to the power line breakage detection unit 5.

Next, at step S508, the power line breakage detection unit 5 detects the presence/absence of a breakage of the power line based on the relationship in magnitude between the index data and the prescribed value. In the case where the index data exceeds the prescribed value, the power line breakage detection unit 5 determines that the power line is broken at step S509. On the other hand, in the case where the index data is equal to or less than the prescribed value, the power line breakage detection unit 5 determines that the power line is not broken, and the procedure returns to step S501 and the determination of the presence/absence of a breakage of the power line is continued based on a new current command value.

As above, in the motor control device according to the fifth embodiment of the present invention, the presence/absence of a breakage of the power line is detected after checking that the rotation speed of the motor is in the range where the voltage command does not saturate at the normal time and the current to the motor is not limited, and therefore, it is possible to accurately detect the presence/absence of a breakage of the power line.

Sixth Embodiment

Figure 11:
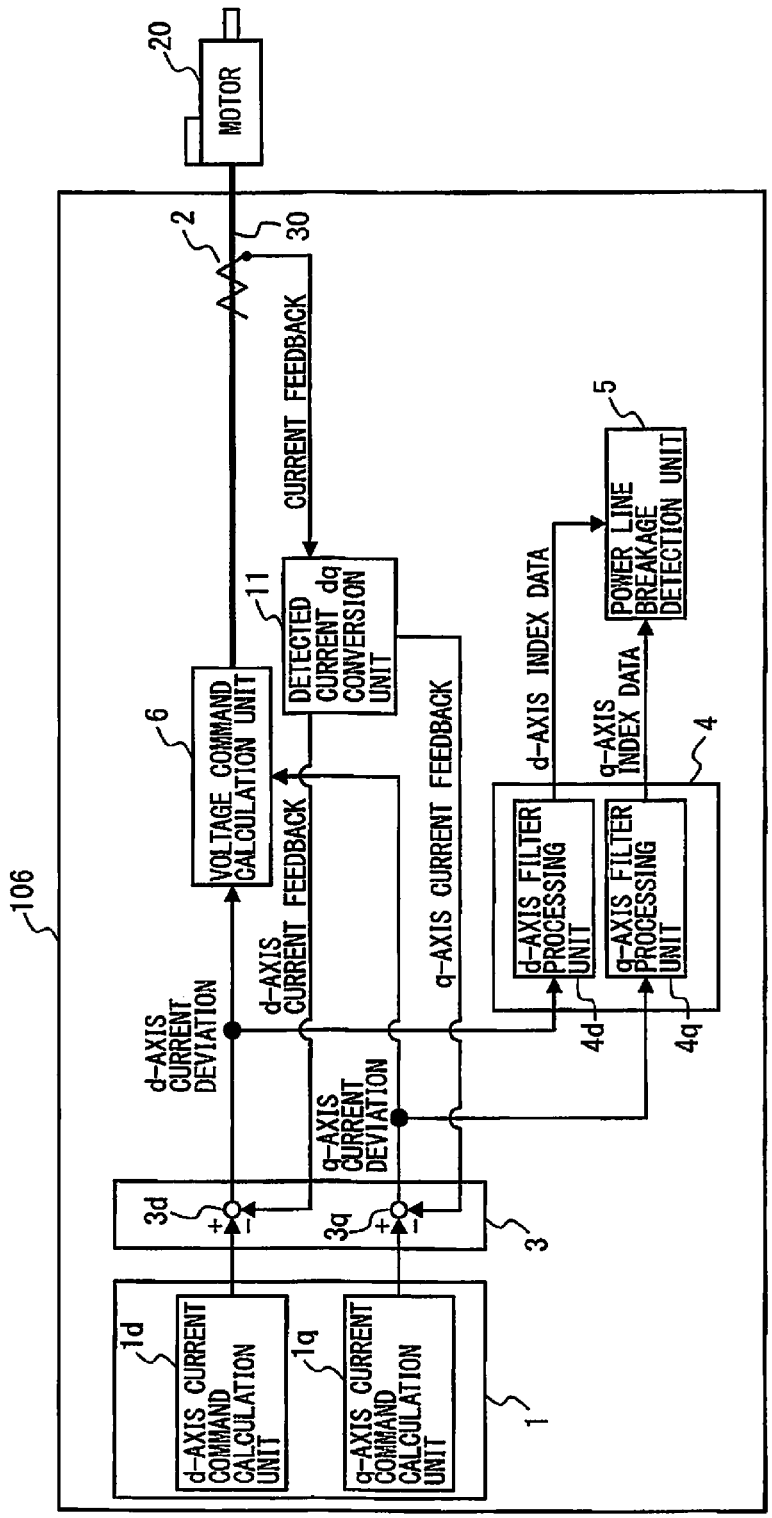
FIG. 11 is a configuration diagram of a motor control device according to a sixth embodiment of the present invention.

Next, a motor control device according to a sixth embodiment of the present invention is explained by using the drawings. FIG. 11 is a configuration diagram of a motor control device according to the sixth embodiment of the present invention. A motor control device 106 according to the sixth embodiment of the present invention differs from the motor control device 101 according to the first embodiment in that a detected current dq conversion unit 11 configured to perform dq conversion to convert the current value detected by the current detection unit 2 into a d-axis current value and a q-axis current value is further provided, the current command calculation unit 1 includes a d-axis current command calculation unit 1*d* configured to calculate a d-axis current command value and a q-axis current command calculation unit 1*q* configured to calculate a q-axis current command value, the current deviation calculation unit 3 includes a d-axis current deviation calculation unit 3*d* configured to calculate a d-axis current deviation, which is a difference between the d-axis current command value and the d-axis current value and a q-axis current deviation calculation unit 3*q* configured to calculate a q-axis current deviation, which is a difference between the q-axis current command value and the q-axis current value, the voltage command calculation unit 6 calculates a voltage command value that is applied to the motor based on the d-axis current deviation and the q-axis current deviation, the filter processing unit 4 includes a d-axis filter processing unit 4*d* configured to calculate data obtained by filtering the d-axis current deviation, the absolute value of the d-axis current deviation, or the power of the d-axis current deviation and to output the data as d-axis index data for detecting a breakage of the power line, and a q-axis filter processing unit 4*q* configured to calculate data obtained by filtering the q-axis current deviation, the absolute value of the q-axis current deviation, or the power of the q-axis current deviation and to output the data as q-axis index data for detecting a breakage of the power line, and the power line breakage detection unit 5 detects a breakage of the power line based on the d-axis index data or the q-axis index data.

The current command calculation unit 1 includes the d-axis current command calculation unit 1*d* and the q-axis current command calculation unit 1*q*. The d-axis current command calculation unit 1*d* calculates the d-axis current command value based on a torque command and outputs the d-axis current command value to the d-axis current deviation calculation unit 3*d*. The q-axis current command calculation unit 1*q* calculates the q-axis current command value based on a torque command and outputs the q-axis current command value to the q-axis current deviation calculation unit 3*q*.

The current deviation calculation unit 3 includes the d-axis current deviation calculation unit 3*d* and the q-axis current deviation calculation unit 3*q*. The d-axis current deviation calculation unit 3*d* is a subtracter and calculates the d-axis current deviation, which is a difference between the d-axis current command value and the detected d-axis current value, by subtracting the d-axis current value, into which converted from the current value detected by the current detection unit 2 by the detected current dq conversion unit 11, from the d-axis current command value calculated by the d-axis current command calculation unit 1*d*. Similarly, the q-axis current deviation calculation unit 3*q* is a subtracter and calculates the q-axis current deviation, which is a difference between the q-axis current command value and the detected q-axis current value, by subtracting the q-axis current value, into which converted from the current value detected by the current detection unit 2 by the detected current dq conversion unit 11, from the q-axis current command value calculated by the q-axis current command calculation unit 1*q*.

The filter processing unit 4 includes the d-axis filter processing unit 4*d* and the q-axis filter processing unit 4*q*. The d-axis current deviation calculated by the d-axis current deviation calculation unit 3*d* is output to the voltage command calculation unit 6 and the d-axis filter processing unit 4*d*. Similarly, the q-axis current deviation calculated by the q-axis current deviation calculation unit 3*q* is output to the voltage command calculation unit 6 and the q-axis filter processing unit 4*q*

The voltage command calculation unit 6 calculates the voltage command value that is applied to the motor 20 based on the d-axis current deviation and the q-axis current deviation. The current detection unit 2 detects the value of current that flows through the power line 30 of the motor when the voltage command value output from the voltage command calculation unit 6 is applied to the motor and outputs the current value to the detected current dq conversion unit 11. The detected current dq conversion unit 11 converts the detected current into the d-axis current and the q-axis current and feeds back the d-axis current and the q-axis current to the d-axis current deviation calculation unit 3*d* and the q-axis current deviation calculation unit 3*q*, respectively.

The d-axis filter processing unit 4d calculates one piece of the data obtained by filtering the d-axis current deviation, the absolute value of the d-axis current deviation, and the power of the d-axis current deviation in order to compensate for a delay that occurs in the current control loop and to remove noise that has piled up on the d-axis current value. The data on which the d-axis filter processing unit 4d has performed the filter processing is output to the power line breakage detection unit 5 as the d-axis index data for detecting a breakage of a d-axis power line.

Similarly, the q-axis filter processing unit 4q calculates one piece of the data obtained by filtering the q-axis current deviation, the absolute value of the q-axis current deviation, and the power of the q-axis current deviation in order to compensate for a delay that occurs in the current control loop and to remove noise that has piled up on the q-axis current value. The data on which the q-axis filter processing unit 4q has performed the filter processing is output to the power line breakage detection unit 5 as the q-axis index data for detecting a breakage of a q-axis power line.

The power line breakage detection unit 5 detects whether or not the power line is broken based on the relationship in magnitude between the d-axis index data and a d-axis prescribed value. In other words, in the case where the d-axis index data is greater than the d-axis prescribed value, the power line breakage detection unit 5 determines that the power line is broken. On the other hand, in the case where the d-axis index data is equal to or less than the d-axis prescribed value, the power line breakage detection unit 5 determines that the power line is not broken. Similarly, the power line breakage detection unit 5 detects whether or not the power line is broken based on the relationship in magnitude between the q-axis index data and a q-axis prescribed value. In other words, in the case where the q-axis index data is greater than the q-axis prescribed value, the power line breakage detection unit 5 determines that the power line is broken. On the other hand, in the case where the q-axis index data is equal to or less than the q-axis prescribed value, the power line breakage detection unit 5 determines that the power line is not broken.

In the motor control device 106 according to the sixth embodiment of the present invention, the d-axis and q-axis index data for the determination of a breakage of the power line is calculated by performing the filter processing on the d-axis current deviation, the q-axis current deviation, etc., for each of the d-axis and the q-axis, and the presence/absence of a breakage of the power line is determined based on the d-axis and q-axis index data. Because of this, even in the case where the d-axis and q-axis current command values have changed considerably or in the case where large noise has piled up on the d-axis and q-axis current values, there is no possibility that the power line is erroneously detected to be broken, and therefore, it is possible to accurately determine the presence/absence of a breakage of the power line.

Figure 12:
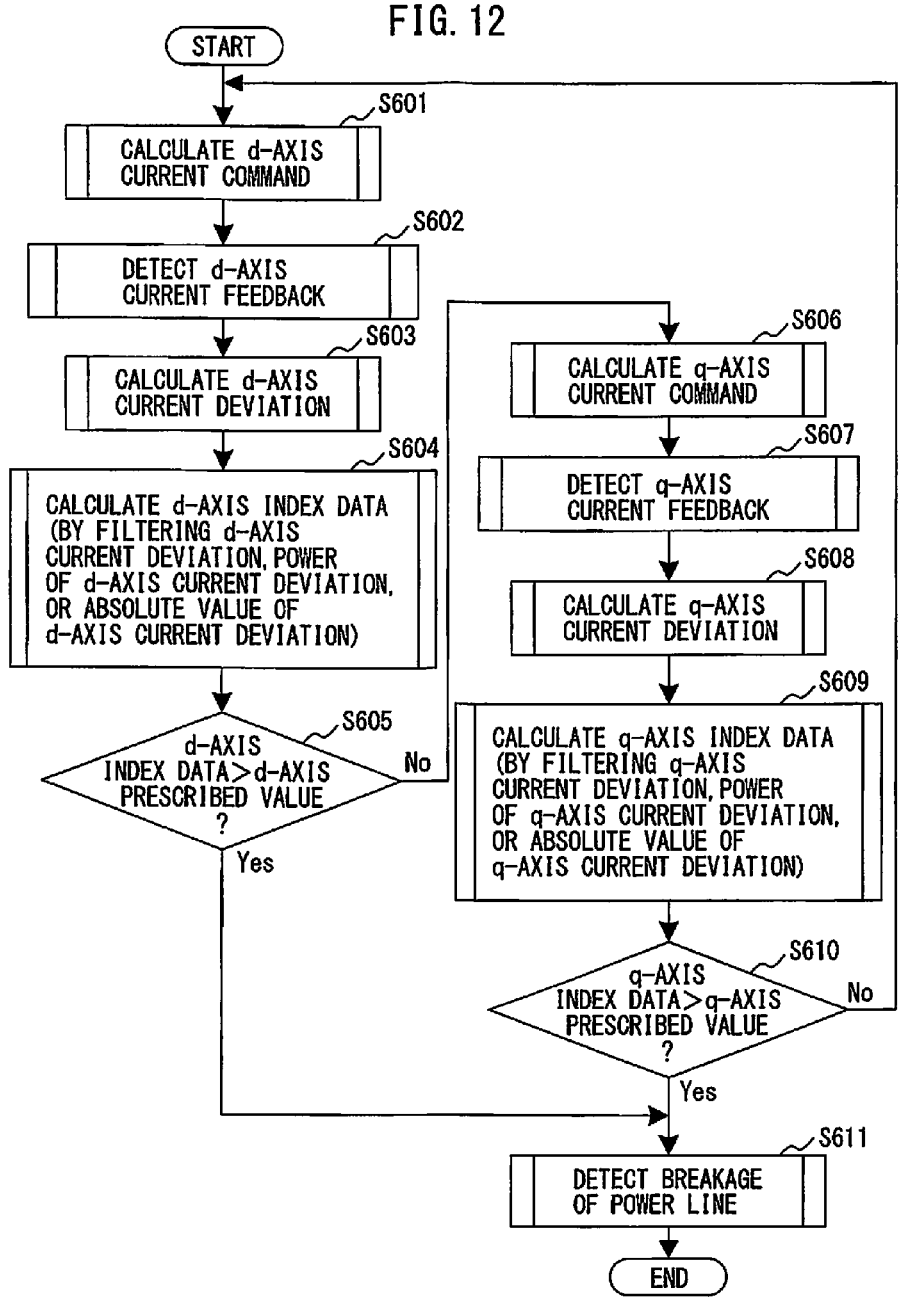
FIG. 12 is flowchart for explaining a procedure to detect a breakage of a power line performed by the motor control device according to the sixth embodiment of the present invention.

Next, an operation procedure of the motor control device according to the sixth embodiment of the present invention is explained. FIG. 12 is a flowchart for explaining a procedure to detect a breakage of the power line performed by the motor control device according to the sixth embodiment of the present invention.

First, at step S601, the d-axis current command calculation unit 1d calculates a d-axis current command value for driving the motor. Next, at step S602, the current detection unit 2 detects the value of a current that flows through the power line 30 of the motor and feeds back the d-axis current value, into which converted by the detected current dq conversion unit 11, to the d-axis current deviation calculation unit 3d.

Next, at step S603, the d-axis current deviation calculation unit 3d calculates a d-axis current deviation, which is a difference between the d-axis current command value and the detected d-axis current value. Next, at step S604, the d-axis filter processing unit 4d calculates d-axis index data for detecting a breakage of the power line. The calculation of the d-axis index data is performed by filtering one of the d-axis current deviation, the absolute value of the d-axis current deviation, and the power of the d-axis current deviation. The calculated d-axis index data is output to the power line breakage detection unit 5.

Next, at step S605, the power line breakage detection unit 5 detects the presence/absence of a breakage of the power line based on the relationship in magnitude between the d-axis index data and the d-axis prescribed value. In the case where the d-axis index data exceeds the d-axis prescribed value, the power line breakage detection unit 5 determines that the power line is broken at step S611. On the other hand, in the case where the d-axis index data is equal to or less than the d-axis prescribed value, the presence/absence of a breakage of the power line is detected for the q-axis.

At step S606, the q-axis current command calculation unit 1q calculates a q-axis current command value for driving the motor. Next, at step S607, the current detection unit 2 detects the value of current that flows through the power line 30 of the motor and feeds back the q-axis current value, into which converted by the detected current dq conversion unit 11, to the q-axis current deviation calculation unit 3q.

Next, at step S608, the q-axis current deviation calculation unit 3q calculates a q-axis current deviation, which is a difference between the q-axis current command value and the detected q-axis current value. Next, at step S609, the q-axis filter processing unit 4q calculates q-axis index data for detecting a breakage of the power line. The calculation of the q-axis index data is performed by filtering one of the q-axis current deviation, the absolute value of the q-axis current deviation, and the power of the q-axis current deviation. The calculated q-axis index data is output to the power line breakage detection unit 5.

Next, at step S610, the power line breakage detection unit 5 detects the presence/absence of a breakage of the power line based on the relationship in magnitude between the q-axis index data and the q-axis prescribed value. In the case where the q-axis index data exceeds the q-axis prescribed value, the power line breakage detection unit 5 determines that the power line is broken at step S611. On the other hand, in the case where the q-axis index data is equal to or less than the q-axis prescribed value, the power line breakage detection unit 5 determines that the power line is not broken, and the procedure returns to step S601 and the determination of the presence/absence of a breakage of the power line is continued based on a new current command value.

As above, in the motor control device according to the sixth embodiment of the present invention, the presence/absence of a breakage of the power line is determined based on the d-axis and q-axis index data calculated by filtering the d-axis and q-axis current deviations for the d-axis and the q-axis, and therefore, even in the case where the d-axis or q-axis current command value has changed considerably or in the case where large noise has piled up on the detected d-axis or q-axis current value, it is possible to perform accurate determination without erroneously detecting a breakage of the power line.

Further, it is possible to detect that the power line is in the broken state in the case where the d-axis index data calculated based on the d-axis current deviation exceeds the d-axis prescribed value, and therefore, it is possible to quickly detect a breakage of the power line. Furthermore, in the case where it is not possible to detect a breakage of the power line from the d-axis current deviation, the presence/absence of a breakage of the power line is detected based on the q-axis current deviation, and therefore, it is possible to accurately detect the presence/absence of a breakage of the power line.

Seventh Embodiment

Figure 13:
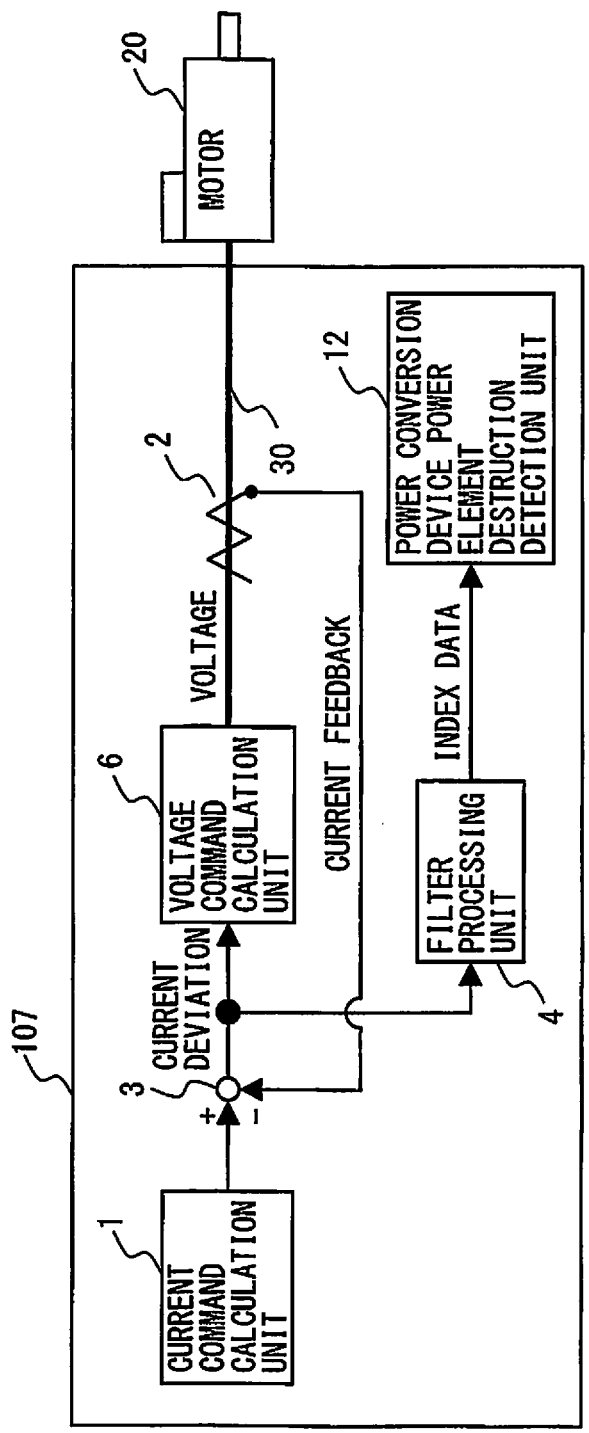
FIG. 13 is a configuration diagram of a motor control device according to a seventh embodiment of the present invention.

Next, a motor control device according to a seventh embodiment of the present invention is explained by using the drawings. FIG. 13 is a configuration diagram of a motor control device according to the seventh embodiment of the present invention. A motor control device 107 according to the seventh embodiment of the present invention is a motor control device that drives the three-phase motor 20 based on a current command and includes the current command calculation unit 1 configured to calculate a current command value for driving the motor, the current detection unit 2 configured to detect the value of current that flows through the power line 30 of the motor, the current deviation calculation unit 3 configured to calculate a current deviation, which is a difference between the current command value and the detected current value, the voltage command calculation unit 6 configured to calculate a voltage command value that is applied to the motor based on the current deviation, the filter processing unit 4 configured to calculate data obtained by filtering the current deviation, the absolute value of the current deviation, or the power of the current deviation and to output the data as index data for detecting destruction of a power element, and a power conversion device power element destruction detection unit 12 configured to detect open fault of a power element of a motor power conversion device based on the index data.

The current command calculation unit 1 calculates a current command value based on a torque command and outputs the current command value to the current deviation calculation unit 3. The current deviation calculation unit 3 is a subtracter and calculates a current deviation, which is a difference between the current command value and the detected current value, by subtracting the current value detected by the current detection unit 2 from the current command value calculated by the current command calculation unit 1.

The current deviation calculated by the current deviation calculation unit 3 is output to the voltage command calculation unit 6 and the filter processing unit 4. The voltage command calculation unit 6 calculates a voltage command value that is applied to the motor 20 based on the current deviation. The current detection unit 2 detects the value of current that flows through the power line 30 of the motor when the voltage command value output from the voltage command calculation unit 6 is applied to the motor, and feeds back the current value to the current deviation calculation unit 3.

The filter processing unit 4 calculates one piece of data obtained by filtering the current deviation, the absolute value of the current deviation, and the power of the current deviation in order to compensate for a delay that occurs in the current control loop and to remove noise that has piled up on the current value. The data on which the filter processing unit 4 has performed the filter processing is output to the power conversion device power element destruction detection unit 12 as index data for detecting destruction of a power element.

The power conversion device power element destruction detection unit 12 determines whether or not the power element of the motor power conversion device is in open fault condition based on the relationship in magnitude between the index data and a prescribed value. In other words, in the case where the index data is greater than the prescribed value, the power conversion device power element destruction detection unit 12 determines that the power element of the motor power conversion device (not illustrated) is in open fault condition. On the other hand, in the case where the index data is equal to or less than the prescribed value, the power conversion device power element destruction detection unit 12 determines that the power element of the motor power conversion device is not in open fault condition.

In the motor control device 107 according to the seventh embodiment of the present invention, the index data for the determination of destruction of the power element is calculated by performing the filter processing on the current deviation or the like and the presence/absence of destruction of the power element is determined based on the index data. Because of this, even in the case where the current command value has changed considerably or in the case where large noise has piled up on the current value, there is no possibility that the power element is erroneously determined to be destroyed, and therefore, it is possible to accurately determine the presence/absence of destruction of the power element.

Figure 14:
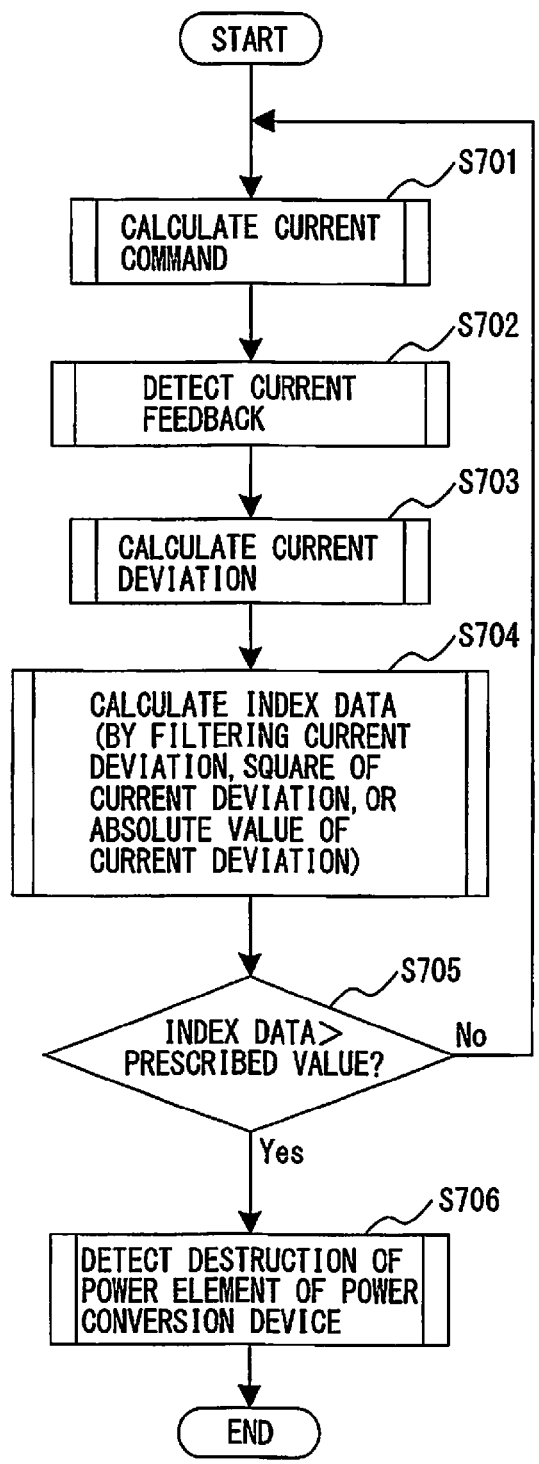
FIG. 14 is flowchart for explaining a procedure to detect an abnormality of a power element of a motor power conversion device performed by the motor control device according to the seventh embodiment of the present invention.

Next, an operation procedure of the motor control device according to the seventh embodiment of the present invention is explained. FIG. 14 is a flowchart for explaining a procedure to detect destruction of a power element performed by the motor control device according to the seventh embodiment of the present invention.

First, at step S701, the current command calculation unit 1 calculates a current command value for driving the motor. Next, at step S702, the current detection unit 2 detects the value of current that flows through the power line 30 of the motor and feeds back the detected current value to the current deviation calculation unit 3.

Next, at step S703, the current deviation calculation unit 3 calculates a current deviation, which is a difference between the current command value and the detected current value. Next, at step S704, the filter processing unit 4 calculates index data for the detection of open fault of the power element of the motor power conversion device. The calculation of the index data is performed by filtering one of the current deviation, the absolute of the current deviation, and the power of the current deviation. The calculated index data is output to the power conversion device power element destruction detection unit 12.

Next, at step S705, the power conversion device power element destruction detection unit 12 detects the presence/absence of destruction of the power element based on the relationship in magnitude between the index data and a prescribed value. In the case where the index data exceeds the prescribed value, the power conversion device power element destruction detection unit 12 determines that the power element is in open fault condition at step S706. On the other hand, in the case where the index data is equal to or less than the prescribed value, the power conversion device power element destruction detection unit 12 determines that the power element is not in open fault condition, and the procedure returns to step S701 and the determination of the presence/absence of destruction of the power element is continued based on a new current command value.

As above, in the motor control device according to the seventh embodiment of the present invention, the presence/absence of destruction of the power element is determined based on the index data calculated by filtering the current deviation or the like, and therefore, even in the case where the current command value has varied considerably or in the case where large noise has piled up on the detected current value, it is possible to perform accurate determination without erroneously detecting open fault of a power element.

As explained above, in the motor control device according to the embodiment of the present invention, by detecting a breakage based on the data obtained by filtering the current deviation, it is possible to avoid erroneous detection due to factors, such as a delay in the current control loop and noise that has piled up on the current value.

Further, on the assumption that the current deviation is large in advance, and by suspending the detection of a breakage in such a case, it is possible to avoid erroneous detection of the broken state of the power line.

Furthermore, even in the case where the power element of the motor drive amplifier is destroyed and enters the open state, and therefore, current no longer flows, which makes it is possible to detect a breakage by applying the same method.

What is claimed is:

1. A motor control device that drives a three-phase motor based on a current command, comprising:
   a current command calculation unit configured to calculate a current command value for driving a motor;
   a current detection unit configured to detect a value of current that flows through a power line of the motor;
   a current deviation calculation unit configured to calculate a current deviation, which is a difference between the current command value and the detected current value;
   a voltage command calculation unit configured to calculate a voltage command value that is applied to the motor based on the current deviation;
   a voltage command saturation determination unit configured to determine whether or not the voltage command value has saturated and to output the results as voltage command saturation determination results;
   a filter processing unit configured to calculate data obtained by filtering the current deviation, the absolute value of the current deviation, or the power of the current deviation in order to compensate for a delay that occurs in the current control loop or to remove noise that has piled up on the current value and configured to output the data as index data for detecting a breakage of the power line; and
   a power line breakage detection unit configured to detect the breakage of the power line based on the index data only in a case of determining that the voltage command value has not saturated in accordance with the voltage command saturation determination results.

2. A motor control device that drives a three-phase motor based on a current command, comprising:
   a current command calculation unit configured to calculate a current command value for driving a motor;
   a current detection unit configured to detect a value of current that flows through a power line of the motor;
   a current deviation calculation unit configured to calculate a current deviation, which is a difference between the current command value and the detected current value;
   a voltage command calculation unit configured to calculate a voltage command value that is applied to the motor based on the current deviation;
   a filter processing unit configured to calculate data obtained by filtering the power of the current deviation in order to compensate for a delay that occurs in the current control loop or to remove noise that has piled up on the current value and configured to output the data as index data for detecting a breakage of the power line;
   a motor speed detection unit configured to detect a rotation speed of the motor;
   a motor speed determination unit configured to determine whether or not the rotation speed of the motor is higher than a prescribed speed for determining whether or not the breakage of the power line is detected based on the index data; and
   a power line breakage detection unit configured to detect the breakage of the power line based on the index data only in a case where the rotation speed of the motor is equal to or less than the prescribed speed.

3. The motor control device according to claim 1, further comprising a detected current dq conversion unit configured to perform dq conversion to convert the current value detected by the current detection unit into a d-axis current value and a q-axis current value, wherein
   the current command calculation unit includes a d-axis current command calculation unit configured to calculate a d-axis current command value and a q-axis current command calculation unit configured to calculate a q-axis current command value,
   the current deviation calculation unit includes a d-axis current deviation calculation unit configured to calculate a d-axis current deviation, which is a difference between the d-axis current command value and the d-axis current value, and a q-axis current deviation calculation unit configured to calculate a q-axis current deviation, which is a difference between the q-axis current command value and the q-axis current value,
   the voltage command calculation unit calculates a voltage command value that is applied to a motor based on the d-axis current deviation and the q-axis current deviation,
   the filter processing unit includes a d-axis filter processing unit configured to calculate data obtained by filtering the d-axis current deviation, the absolute value of the d-axis current deviation, or the power of the d-axis current deviation in order to compensate for a delay that occurs in the current control loop or to remove noise that has piled up on the current value and configured to output the data as d-axis index data for detecting a breakage of the power line, and a q-axis filter processing unit configured to calculate data obtained by filtering the q-axis current deviation, the absolute value of the q-axis current deviation, or the power of the q-axis current deviation in order to compensate for a delay that occurs in the current control loop or to remove noise that has piled up on the current value and configured to output the data as q-axis index data for detecting a breakage of the power line, and
   the power line breakage detection unit detects a breakage of the power line based on the d-axis index data or the q-axis index data.

* * * * *